United States Patent
Umezawa

(10) Patent No.: US 12,518,974 B2
(45) Date of Patent: Jan. 6, 2026

(54) STRUCTURE MANUFACTURING METHOD AND STRUCTURE

(71) Applicant: FUJIFILM CORPORATION, Tokyo (JP)

(72) Inventor: Tomokazu Umezawa, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 326 days.

(21) Appl. No.: 17/929,309

(22) Filed: Sep. 2, 2022

(65) Prior Publication Data

US 2022/0415663 A1 Dec. 29, 2022

Related U.S. Application Data

(63) Continuation of application No. PCT/JP2021/005058, filed on Feb. 10, 2021.

(30) Foreign Application Priority Data

Mar. 25, 2020 (JP) .................. 2020-055019

(51) Int. Cl.
*H01L 21/308* (2006.01)
*H01L 21/02* (2006.01)
(Continued)

(52) U.S. Cl.
CPC .... *H01L 21/3086* (2013.01); *H01L 21/02178* (2013.01); *H01L 21/02343* (2013.01);
(Continued)

(58) Field of Classification Search
CPC ........... H01L 21/3086; H01L 21/02178; H01L 21/0243; H01L 21/30625; H01L 21/31122
See application file for complete search history.

(56) References Cited

U.S. PATENT DOCUMENTS

2016/0114502 A1\* 4/2016 Han ..................... G02B 5/3058
216/47
2017/0263461 A1\* 9/2017 Matsubara .............. H01L 21/78
(Continued)

FOREIGN PATENT DOCUMENTS

JP 2007005528 A \* 1/2007
JP 2009-128538 A 6/2009
(Continued)

OTHER PUBLICATIONS

Wikipedia, "Photoresist" via https://web.archive.org/web/20191218100015/https://en.wikipedia.org/wiki/Photoresist; pp. 1-9 (Year: 2019).\*

(Continued)

*Primary Examiner* — Binh X Tran
(74) *Attorney, Agent, or Firm* — SOLARIS Intellectual Property Group, PLLC

(57) ABSTRACT

A structure is manufactured by forming a mask that has an opening pattern on a fine recessed and projected structure of a substrate having the fine recessed and projected structure with an average period of 1 μm or less on a surface thereof, etching the surface of the substrate from a side of the mask to form a recessed portion which has an opening greater than the average period of the fine recessed and projected structure according to the opening pattern of the mask, the recessed portion having a depth equal to or greater than double a difference in height between recesses and projections of the fine recessed and projected structure, and then removing the mask.

10 Claims, 13 Drawing Sheets

(51) Int. Cl.
*H01L 21/027* (2006.01)
*H01L 21/3065* (2006.01)
*H01L 21/311* (2006.01)

(52) U.S. Cl.
CPC .... *H01L 21/0275* (2013.01); *H01L 21/30655* (2013.01); *H01L 21/31122* (2013.01); *H01L 21/31138* (2013.01)

(56) References Cited

U.S. PATENT DOCUMENTS

| | | | | |
|---|---|---|---|---|
| 2019/0067519 | A1* | 2/2019 | Niwa | H10H 20/822 |
| 2019/0146329 | A1* | 5/2019 | Inazuki | G03F 1/26 430/5 |

FOREIGN PATENT DOCUMENTS

| | | | |
|---|---|---|---|
| JP | 2009-206339 | A | 9/2009 |
| JP | 2013-222925 | A | 10/2013 |
| JP | 2015059977 | A * | 3/2015 |
| JP | 5797133 | B2 | 10/2015 |
| JP | 2017-162959 | A | 9/2017 |
| JP | 2019-040039 | A | 3/2019 |
| JP | 2019-040980 | A | 3/2019 |
| JP | 2019-153704 | A | 9/2019 |
| WO | 2016/163510 | A1 | 10/2016 |

OTHER PUBLICATIONS

International Search Report issued in International Application No. PCT/JP2021/005058 on Apr. 27, 2021.
Written Opinion of the ISA issued in International Application No. PCT/JP2021/005058 on Apr. 27, 2021.
English language translation of the following: Office action dated May 16, 2023 from the JPO in a Japanese patent application No. 2022-509383 corresponding to the instant patent application.
English language translation of the following: Notice dated Jun. 16, 2025 from the SIPO in a Chinese patent application No. 202180021056.3 corresponding to the instant patent application. This office action translation is submitted now in order to supplement the understanding of the cited reference which is being disclosed in the instant Information Disclosure Statement.

* cited by examiner

STRUCTURE MANUFACTURING METHOD AND STRUCTURE

CROSS-REFERENCE TO RELATED APPLICATIONS

This application is a continuation application of International Application No. PCT/JP2021/005058, filed Feb. 10, 2021, the disclosure of which is incorporated herein by reference in its entirety. Further, this application claims priority from Japanese Patent Application No. 2020-055019, filed Mar. 25, 2020, the disclosure of which is incorporated herein by reference in its entirety.

BACKGROUND OF THE INVENTION

1. Field of the Invention

The present disclosure relates to a structure manufacturing method and a structure.

2. Description of the Related Art

In the related art, various methods for forming a fine recessed and projected structure on a surface of a substrate have been studied.

For example, JP5797133B discloses a method of forming a fine recessed and projected structure on a surface of a base material by providing a boehmite layer having fine recesses and projections on the surface of the substrate and etching the boehmite layer as a mask.

Further, JP2019-40039A discloses a method of forming a fine recessed and projected structure on the surface of the substrate by irregularly attaching chromium (Cr) particles to the surface of the substrate and etching the irregularly attached Cr particles as a mask.

On the other hand, there is known an imprint method in which a mold having a recessed and projected pattern on the surface is used and the recessed and projected pattern is transferred to the surface of the substrate to form a fine recessed and projected structure by a resin layer on the surface of the substrate. JP2019-153704A discloses, as a method of manufacturing an imprint mold having a stepped recessed portion, a method of manufacturing an imprint mold having a recessed and projected structure on the surface by repeating lithography and etching a plurality of times.

Further, JP2009-128538A discloses a method of forming micrometer-sized recesses and projections on the surface of the substrate and then forming micrometer-sized recesses and projections having a period smaller than that of the micrometer-sized recesses and projections on the surface of the recessed portions and projected portions.

SUMMARY OF THE INVENTION

By using the methods described in JP5797133B, JP2019-40039A, and JP2019-153704A, it is possible to form a fine recessed and projected structure smaller than a micrometer size on the surface of the substrate, respectively. Further, by using the method described in JP2009-128538A, it is possible to produce a structure in which two kinds of recessed and projected structures having different periods are formed.

The present inventors have studied that a structure having a fine recessed and projected structure relatively smaller than recessed portions is manufactured not on the recessed portions but on at least a part of the surface of the substrate remaining around the recessed portions in a case where the recessed portions are formed on the surface of the substrate. However, JP5797133B, JP2019-40039A, and JP2019-153704A do not disclose a method of manufacturing such a structure. Further, in a case where the method described in JP2009-128538A is used, a similar fine recessed and projected structure is formed not only on the surface of the substrate remaining around the recessed portions but also on the bottom surface of the recessed portions in a case where the recessed portions have a bottom.

The present disclosure has been made in view of the above circumstances, and has an object to provide a structure and a manufacturing method of manufacturing the structure, which has a fine recessed and projected structure relatively smaller than recessed portions, not on the recessed portions but on at least a part of the surface of the substrate remaining around the recessed portions in a case where the recessed portions are formed on the surface of the substrate.

The structure manufacturing method of the present disclosure includes:

a mask formation step of forming a mask that has an opening pattern on a fine recessed and projected structure of a substrate having the fine recessed and projected structure with an average period of 1 μm or less on a surface thereof;

a dry etching step of etching the surface of the substrate from a side of the mask to form a recessed portion which has an opening greater than the average period of the fine recessed and projected structure according to the opening pattern of the mask, the recessed portion having a depth equal to or greater than double a difference in height between recesses and projections of the fine recessed and projected structure; and a mask removal step of removing the mask after the dry etching step.

In the structure manufacturing method of the present disclosure, it is preferable that the fine recessed and projected structure is an irregular structure.

In the structure manufacturing method of the present disclosure, the recessed portion formed in the dry etching step may be a through-hole penetrating the substrate.

In the structure manufacturing method of the present disclosure, in the dry etching step, streaky grooves along a depth direction of the recessed portions may be formed in at least a part of an inner wall surface of the recessed portions.

In the structure manufacturing method of the present disclosure, an etching gas used in the dry etching step may include a fluorine-based gas or a chlorine-based gas.

In the structure manufacturing method of the present disclosure, an etching gas and an etching protective gas may be alternately used in the dry etching step.

In the structure manufacturing method of the present disclosure, the mask formation step may include a step of applying a photoresist, a step of exposing the photoresist, and a step of developing the photoresist.

In the structure manufacturing method of the present disclosure, the mask formation step may include a resin layer coating step and a pattern transfer step to the resin layer.

In the structure manufacturing method of the present disclosure, the mask removal step may include a dry etching step or a cleaning step using sulfuric acid hydrogen peroxide.

The structure manufacturing method of the present disclosure may further include a fine recessed and projected structure formation step of forming the fine recessed and projected structure on the surface of the substrate, in which the fine recessed and projected structure formation step includes a step of forming a thin film including aluminum on the surface of the substrate, a step of changing the thin film including aluminum into a fine recessed and projected layer including alumina hydrate through hot water treatment, a step of etching the surface of the substrate from a side of the fine recessed and projected layer, and a step of removing the fine recessed and projected layer.

In the structure manufacturing method of the present disclosure, it is preferable that the substrate is a silicon substrate or a silicon compound substrate.

The structure of the present disclosure comprises: a substrate; a recessed portion that is formed on a surface of the substrate; and a fine recessed and projected structure that has an average period of 1 µm or less formed only on the surface of the substrate and at least on a periphery of the recessed portion of the surface, in which an opening of the recessed portion is greater than the average period of the fine recessed and projected structure.

In the structure of the present disclosure, it is preferable that the fine recessed and projected structure is an irregular structure.

According to the structure manufacturing method of the present disclosure, it is possible to obtain a structure, which has a fine recessed and projected structure relatively smaller than recessed portions, not on the recessed portions but on at least a part of the surface of the substrate remaining around the recessed portions in a case where the recessed portions are formed on the surface of the substrate.

DESCRIPTION OF THE PREFERRED EMBODIMENTS

Hereinafter, embodiments of the present disclosure will be described with reference to the accompanying drawings.

For easy visibility, the film thickness of each layer and their ratios are appropriately changed and drawn, and do not necessarily reflect the actual film thickness and proportion. In the present specification, the numerical range represented by using "to" means a range including the numerical values before and after "to" as the lower limit value and the upper limit value.

The structure manufacturing method of the present disclosure includes: a mask formation step of forming a mask having an opening on a fine recessed and projected structure of a substrate having a fine recessed and projected structure with an average period of 1 µm or less on a surface thereof; a dry etching step of etching the surface of the substrate from the mask side to form a recessed portion which has an opening greater than the average period of the fine recessed and projected structure according to the opening of the mask and which has a depth equal to or greater than double a difference in height between recesses and projections of the fine recessed and projected structure; and a mask removal step of removing the mask after the dry etching step.

Figure 1:
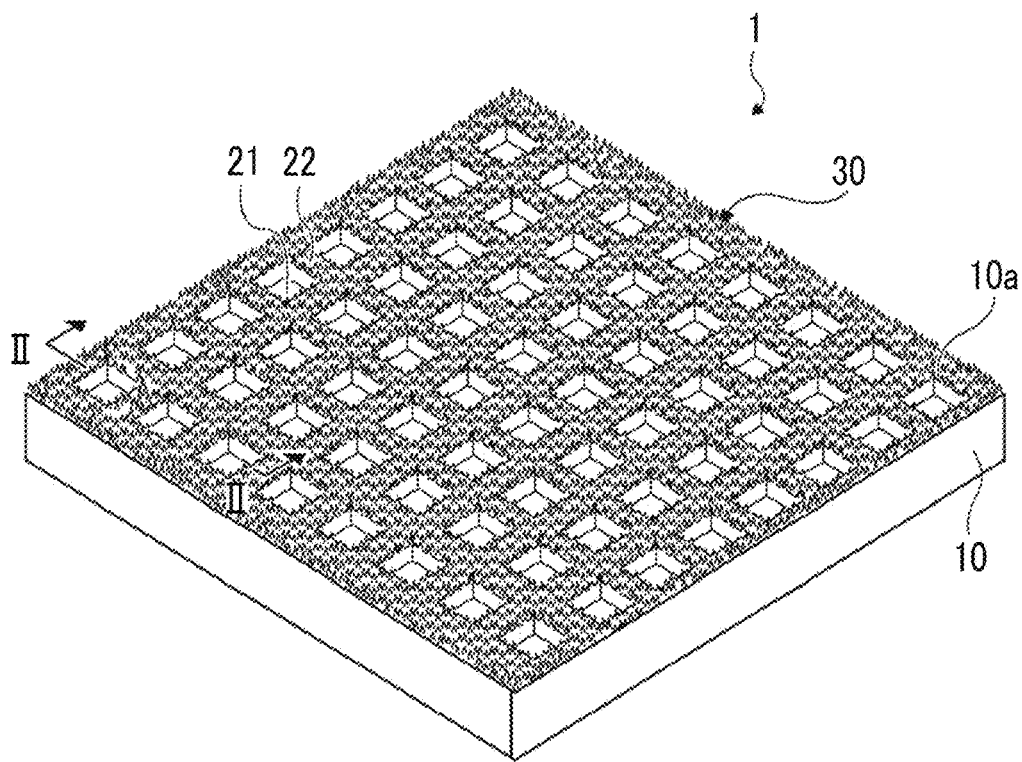
FIG. 1 is a perspective view of a structure of an embodiment.
Figure 2:
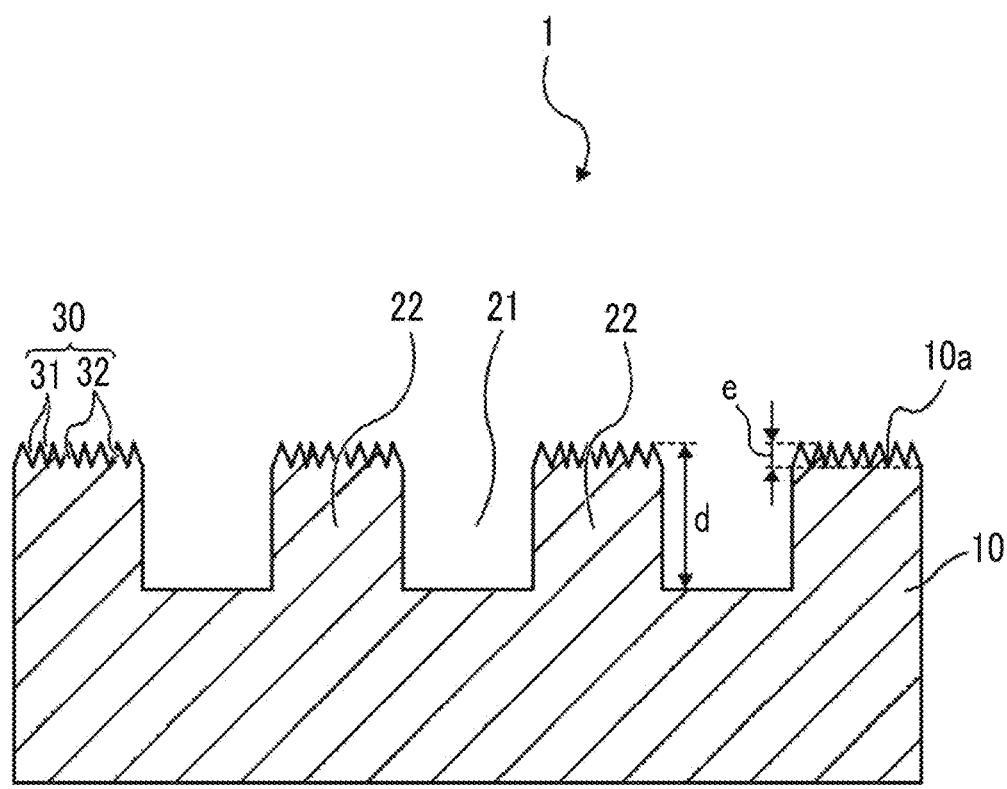
FIG. 2 is an end section view of the structure shown in FIG. 1 cut along the line II-II.

First, an example of the structure of the present disclosure obtained by an embodiment of the structure manufacturing method of the present disclosure will be described. FIG. 1 is a perspective view of an example of the structure of the present disclosure obtained by the embodiment of the manufacturing method of the present disclosure. FIG. 2 is a diagram showing a partially cut end section of the structure 1 shown in FIG. 1. The structure 1 includes a substrate 10 and recessed portions 21 formed on the surface 10a of the substrate 10. Since the recessed portions 21 are formed on the surface 10a of the substrate 10 of the structure 1, the surface 10a of the substrate 10 remains on a projected portion 22 around the recessed portions 21. The structure 1 is provided with a fine recessed and projected structure 30 that is relatively smaller than the recessed portions 21 on the surface 10a of the substrate 10 that remains as the projected portion 22. The fine recessed and projected structure is a recessed and projected structure with an average period of 1 µm or less. In the structure 1, an opening of each recessed portion 21 is greater than the average period of the fine recessed and projected structure 30, and a depth d of the recessed portion 21 is equal to or greater than double a difference e in height between recesses and projections of the fine recessed and projected structure 30. The depth d of the recessed portion 21 is a distance from the projection tip portion of the fine recessed and projected structure 30 formed in the projected portion 22 to the bottom surface 21a of the recessed portion 21 in a case where the recessed portion 21 has a bottom. In a case where the recessed portion 21 is a through-hole, the depth d of the recessed portion 21 is equal to the thickness of the substrate 10. As described above, in a case where the recessed portions 21 are formed on the surface 10a of the substrate 10, the structure 1 has a fine recessed and projected structure 30, which is relatively smaller than the recessed portion 21, not on the recessed portions 21 but only on the surface 10a of the substrate 10 remaining around the recessed portions 21.

The fine recessed and projected structure 30 in the structure 1 is a structure which includes a plurality of recessed portions 31 and a plurality of projected portions 32 and in which the recessed portions and the projected portions are continuously and repeatedly arranged. The fine recessed and projected structure 30 may be a regularly arranged structure, but may be an irregular structure as shown in FIG. 2. Here, the term "irregular structure" means a structure, in which at least one of the size, shape and arrangement pitch of the projected portions 32 is not regular, such as a structure in which the size or shape of the projected portions 32 is not uniform or a structure in which the arrangement pitch as the distance between adjacent projected portions 32 is not uniform. The average period of the fine recessed and projected structure 30 is 1 μm or less. Here, the average period of the fine recessed and projected structure 30 is an average of the distances between the plurality of projected portions 32. Each distance between the projected portions 32 is, in a case of focusing on one projected portion 32, a distance from a projected portion located closest to the projected portion 32 and is a distance between the tips of the two projected portions. Specifically, in a scanning electron microscope (SEM) image of the surface of the structure, the distances between the projected portions 32 at optional 10 locations are measured, and a value obtained by averaging the measured distances is the average period of the fine recessed and projected structure 30. The average period of the fine recessed and projected structure 30 is, for example, in a range of several nm to 1 μm, preferably in a range of 10 nm to 800 nm, more preferably in a range of 10 nm to 400 nm, and still more preferably in a range of 10 nm to 200 nm. The difference e in height between recesses and projections of the fine recessed and projected structure 30 is, for example, in a range of several nm to 1 μm, preferably in a range of 10 nm to 800 nm, and more preferably in a range of 100 nm to 500 nm.

The size of the recessed portion 21 in the structure 1 is greater than the average period of the fine recessed and projected structure 30. For example, the size of the recessed portion 21 can be set in a range of several μm to several tens of μm, and the average period of the fine recessed and projected structure 30 can be set in a range of several nm to several 100 nm. As described above, the size of the recessed portion 21 and the average period of the fine recessed and projected structure 30 may differ by one digit or more. It is apparent that the sizes may be different within the same number of digits. For example, the average period of the fine recessed and projected structure 30 is 100 nm in a case where the size of the recessed portion 21 is 500 nm, the average period of the fine recessed and projected structure 30 is 1 μm in a case where the size of the recessed portion 21 is 5 μm, and so on. Here, the size of the recessed portion 21 is defined by a circle-equivalent diameter of the opening. Here, the circle-equivalent diameter means a diameter of a circle having the same area as an area of the opening.

On the other hand, the depth d of the recessed portion 21 may be twice or more the difference e in height between recesses and projections of the fine recessed and projected structure 30, but is preferably 5 times or more, and more preferably 10 times or more the difference e in height between recesses and projections. The depth d of the recessed portion 21 is, for example, in a range of 1 μm to several mm.

Figure 3:
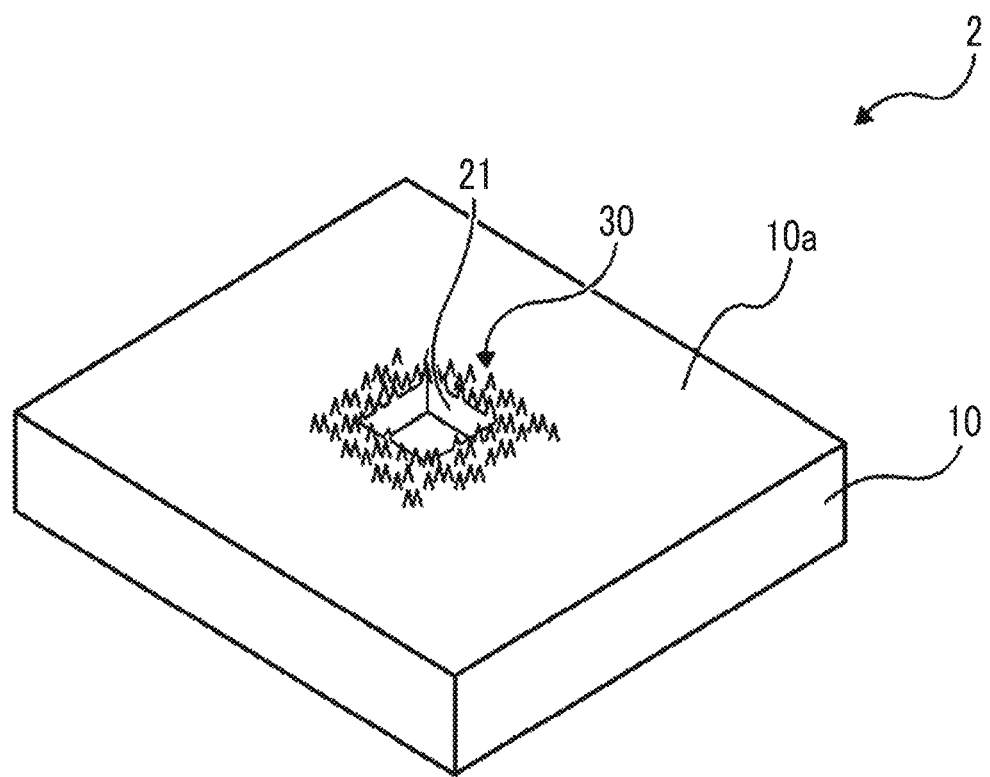
FIG. 3 is a perspective view of a structure of a design modification example.

Although the structure 1 shown in FIG. 1 has a plurality of recessed portions 21, the structure of the present disclosure may have only one recessed portion 21 as in a structure 2 shown in FIG. 3. Further, unlike the structure 1 shown in FIG. 1, it is not necessary to have the fine recessed and projected structure 30 throughout the entire surface 10a of the substrate 10 remaining around the recessed portion 21. As shown in FIG. 3, the fine recessed and projected structure 30 may be provided on a part of the surface 10a of the substrate 10 remaining around the recessed portion 21. In the example shown in FIG. 3, more specifically, the fine recessed and projected structure is formed only on the periphery of the recessed portion 21. Here, the periphery of the recessed portion 21 refers to a region surrounding the opening of the recessed portion 21 and having a width of 20% of the size of the recessed portion 21 in a direction away from the edge of the opening.

The structure 1 in the present example can be applied as a microwell plate used in biochemical analysis, clinical examination, and the like, in which the recessed portion 21 is used as a sample well. Alternatively, the structure 1 can also be used as a mold for manufacturing a structure in which a plurality of projected portion structures are two-dimensionally arranged. The structure, in which the plurality of projected portion structures are arranged, can be produced by filling the plurality of recessed portions 21 with the curable composition, curing the curable composition in a state where the curable composition filled in the recessed portions 21 is in contact with the surface of a separately provided substrate to be transferred, and then peeling the structure 1 from the substrate to be transferred.

The fine recessed and projected structure 30 having an average period of 1 μm or less can have a water-repellent function. Thus, in a case where a liquid such as a sample liquid or a curable composition is injected into the recessed portions 21 as described above, the liquid is repelled on the surface of the substrates adjacent to openings of the recessed portions. As a result, it is easy to inject the liquid into the recessed portions 21.

Figure 4:
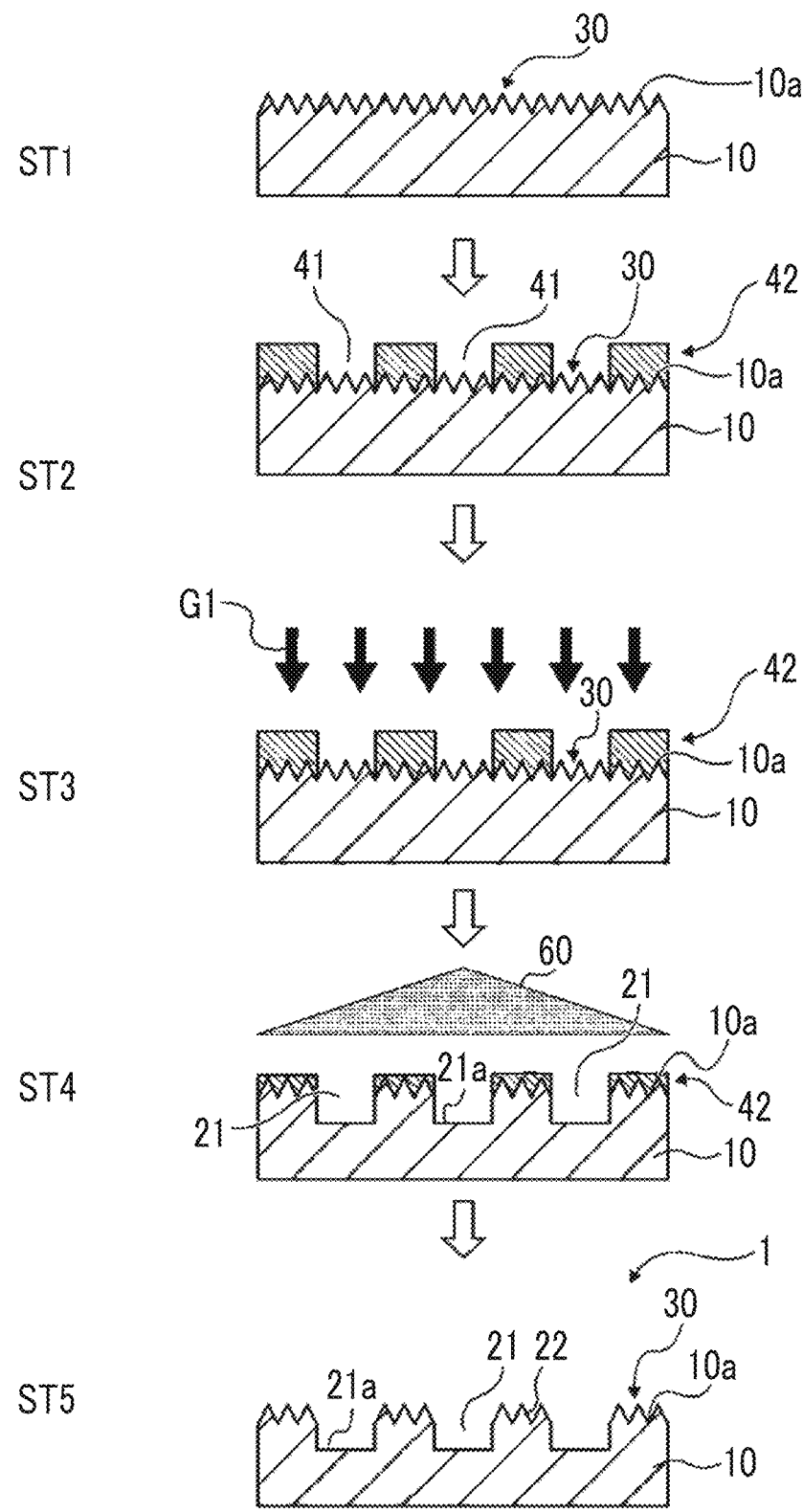
FIG. 4 is a diagram showing steps of a manufacturing method of the embodiment.

Next, an embodiment of the manufacturing method of the present disclosure for manufacturing the structure 1 will be described with reference to FIG. 4. FIG. 4 is a diagram schematically showing a manufacturing step. In the structure manufacturing method of the present embodiment, the mask formation step, the dry etching step, and the mask removal step are performed in this order on the substrate 10 having the fine recessed and projected structure 30 having an average period of 1 μm or less on a surface 10a thereof.

First, as shown in ST1 of FIG. 4, a substrate 10 having a fine recessed and projected structure 30 having an average period of 1 μm or less is provided on the surface 10a. The step of providing the substrate 10 having the fine recessed and projected structure 30 will be described later.

Next, as shown in ST2 of FIG. 4, in the mask formation step, a mask 42 having an opening pattern 41 is formed on the fine recessed and projected structure 30.

Then, as shown in ST3 of FIG. 4, in the dry etching step, dry etching using the etching gas G1 is performed on the surface 10a of the substrate 10 by using the mask 42 formed in the mask formation step. By this dry etching, a recessed portion 21 corresponding to the opening pattern of the mask 42 is formed on the surface 10a of the substrate 10. In a case where the recessed portion 21 is formed by etching from the surface side of the substrate 10 provided with the fine recessed and projected structure 30, the etching proceeds such that the recessed and projected shape of the surface of the fine recessed and projected structure 30 on the substrate surface gradually recedes. Thereafter, as the etching progresses, the difference in height between recesses and projections is gradually reduced. In a case where the original fine recessed and projected structure 30 is removed by etching and a recessed portion having a depth twice the difference e in height between recesses and projections of the fine recessed and projected structure is formed, the recessed and projected structure rarely remains on the bottom surface of the recessed portion, and a recessed portion having no fine recessed and projected structure on the bottom surface can be obtained. By setting the depth of the recessed portion to 5 times or more, more preferably 10 times or more the difference e in height between recesses and projections, a recessed portion having a further increased flatness of the bottom surface can be obtained. Here, a phrase "having no fine recessed and projected structure 30" means that there is no fine recessed and projected structure in which recessed portions and projected portions are repeatedly arranged at the same period as the fine recessed and projected structure 30 formed on the surface 10a. It is permissible to have one or more isolated minute projected portions formed on the bottom surface 21a in the dry etching step.

Finally, as shown in ST4 of FIG. 4, in the mask removal step, the stripper 60 is sprayed onto the substrate 10 to remove the mask 42 remaining after the dry etching step.

Through the above steps, the structure 1 shown in ST5 of FIG. 4 can be obtained.

As described above, in the structure manufacturing method of the present embodiment, the above-mentioned mask formation step, dry etching step, and mask removal step are performed on the substrate 10 provided with the fine recessed and projected structure 30 having an average period of 1 μm or less on a surface 10a thereof. In a case where the recessed portions 21 are formed on the surface 10a of the substrate 10 by this manufacturing method, it is possible to obtain the structure 1 provided with the fine recessed and projected structure 30 relatively smaller than the recessed portions 21 not on the recessed portions 21 but on at least a part of the surface 10a of the substrate 10 remaining around the recessed portions 21.

Hereinafter, details of the steps will be described.

The material of the substrate 10 is not particularly limited, but for example, a silicon or a silicon compound can be used. The silicon or the silicon compound is preferable because it is easy to control the etching selectivity. Examples of the silicon compound include silicon oxide and silicon nitride. Specifically, a silicon wafer, quartz glass, or the like can be used in the substrate 10.

<Mask Formation Step>

The method of forming the mask 42 and the mask material in the mask formation step are not particularly limited, but it is preferable that the mask 42 is made of an organic material. In a case where an organic material is used, a mask 42 having a desired opening pattern can be easily formed. Hereinafter, a method of forming the mask 42 from the organic material will be briefly described.

Figure 5:
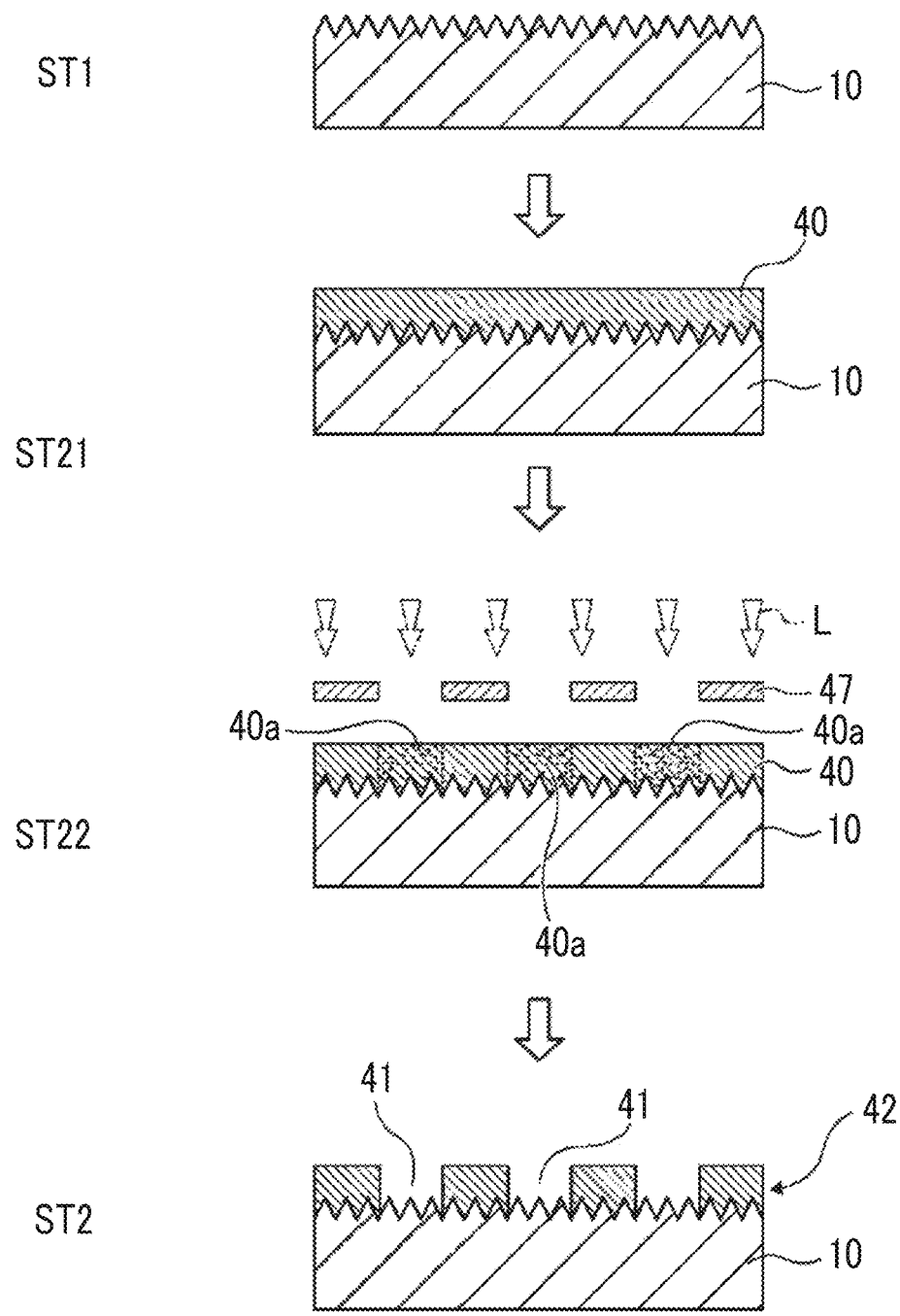
FIG. 5 is a diagram showing an example of a mask formation step.

An exemplary mask formation step includes a step of applying a photoresist, a step of exposing the photoresist, and a step of developing the photoresist. As shown in ST21 of FIG. 5, a positive photoresist 40 is applied to the surface 10a of the substrate 10. As shown in ST22 of FIG. 5, an exposure mask 47 is disposed on the photoresist 40, and light (for example, laser light L) is applied to the part 40a forming the opening of the photoresist 40 to expose the photoresist 40. Then, by developing the photoresist 40, only the exposed part 40a of the photoresist 40 can be dissolved to form an opening, and the mask 42 having the opening pattern 41 can be formed (ST2).

Figure 6:
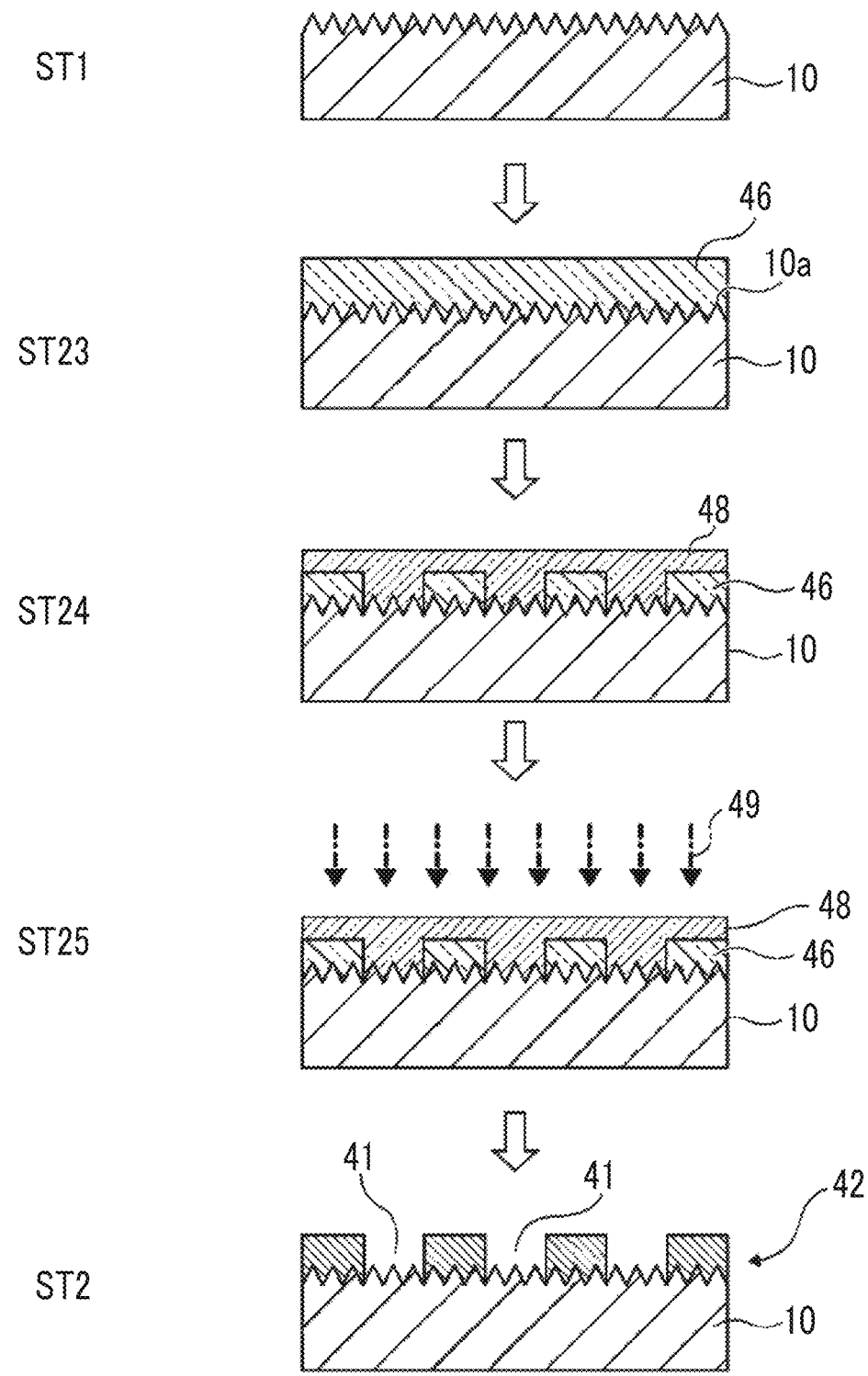
FIG. 6 is a diagram showing another example of the mask formation step.

Alternatively, the mask formation step of another example may include a step of applying the resin layer and a step of transferring the recessed and projected pattern to the resin layer. As shown in ST23 of FIG. 6, a resin layer 46 consisting of, for example, a photocurable resin composition is applied to the surface 10a of the substrate 10. Then, as shown in ST24 of FIG. 6, by using an imprinting mold 48 having a recessed and projected pattern corresponding to the opening pattern 41 of the mask 42 to be formed, the recessed and projected pattern surface is pressed against the resin layer 46, and the recessed and projected pattern is transferred to the resin layer 46. Then, as shown in ST25 of FIG. 6, the resin layer 46 is cured by irradiating the resin layer 46 with ultraviolet light 49, and then the imprinting mold 48 is peeled off. Thereby, it is possible to obtain the mask 42 having the opening pattern 41 on the substrate 10.

<Dry Etching Step>

In the dry etching step, reactive ion etching is preferable. In order to make the etching rate for the substrate 10 greater than the etching rate for the mask 42, it is preferable to use the etching gas G1 having favorable etching efficiency for the substrate 10. Specifically, for example, in a case where silicon is used for the substrate, the etching gas may be a fluorine-based gas or a chlorine-based gas. As the fluorine-based gas, for example, trifluoromethane ($CFH_3$) or sulfur hexafluoride ($SF_6$) can be employed, and as the chlorine-based gas, for example, chlorine ($Cl_2$) can be employed.

Figure 7:
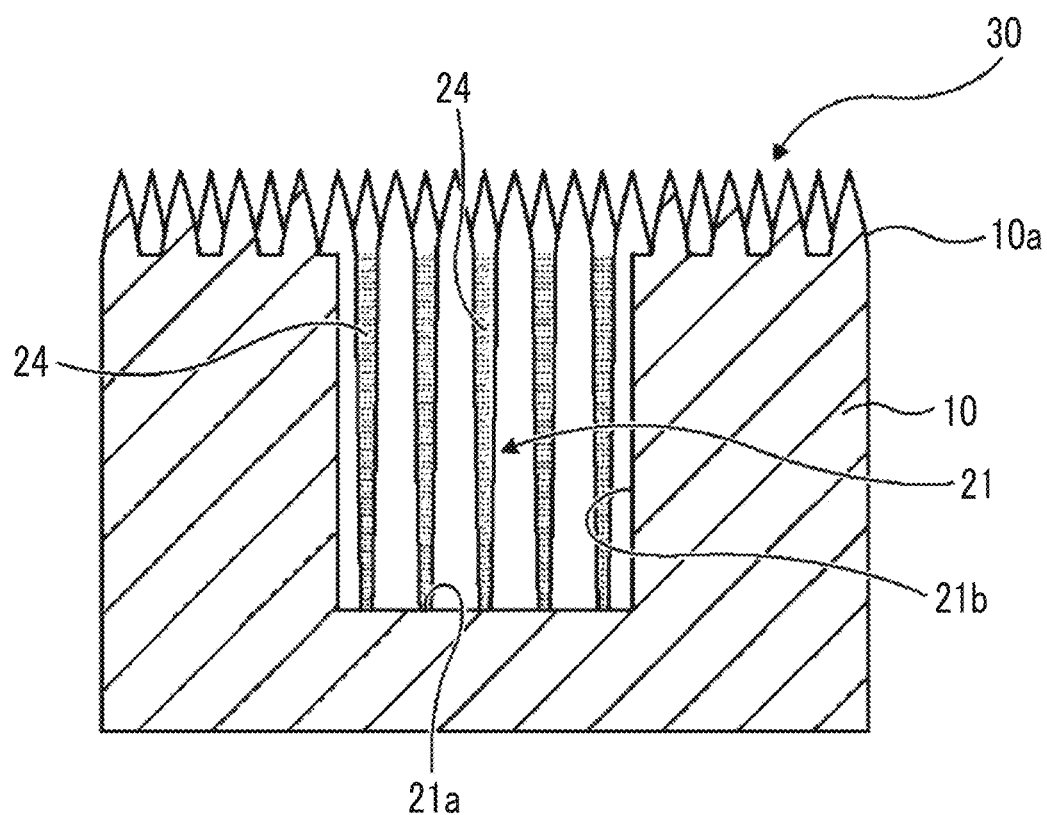
FIG. 7 is a diagram showing an inner wall surface of a recessed portion.

In a case where the recessed portion 21 is formed by dry etching on the substrate 10 provided with the fine recessed and projected structure 30 on the surface 10a, as shown in FIG. 7, streaky grooves 24 corresponding to the recesses and projections of the fine recessed and projected structure 30 are formed on the inner wall surface 21b of the recessed portion 21. FIG. 7 is a cross-sectional view of a part of the structure 1 including one recessed portion 21. The streaky grooves 24 are formed on the inner wall surface 21b of the recessed portion 21. The streaky grooves 24 have a width substantially corresponding to the width of the projected portion 32 of the fine recessed and projected structure 30 or the distance between the projected portions 32, and extend along the depth direction of the recessed portion 21. In FIG. 7, the gray hatched parts indicate the grooves 24 that are recessed with respect to the white part. The width of the streaky groove 24 has a width substantially corresponding to the width of the projected portion 32 or the distance between the projected portions 32 on the surface layer side in the depth direction, but the width gradually decreases on the deep layer side.

Figure 8:
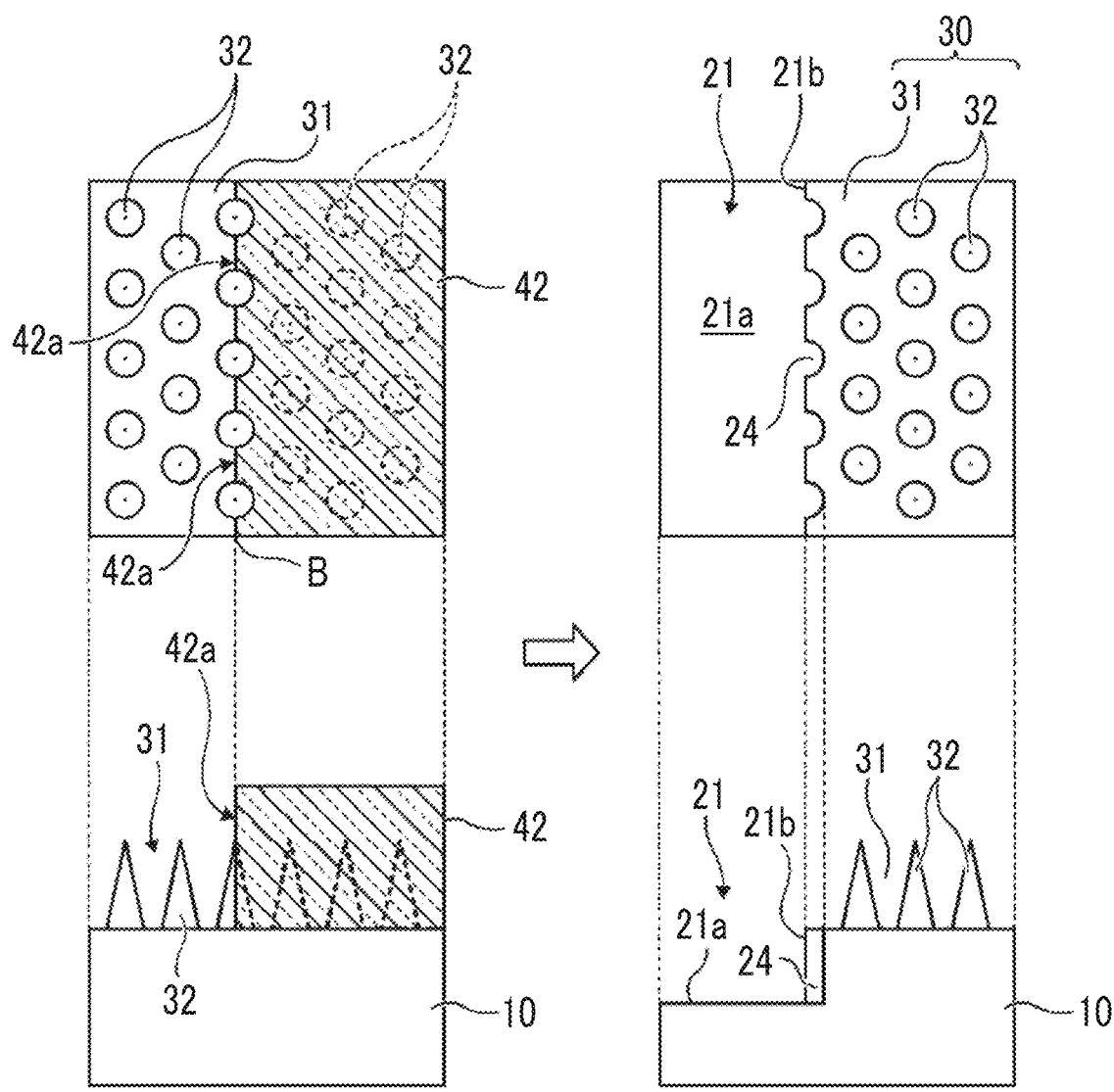
FIG. 8 is a diagram for explaining an etching step.
Figure 9:
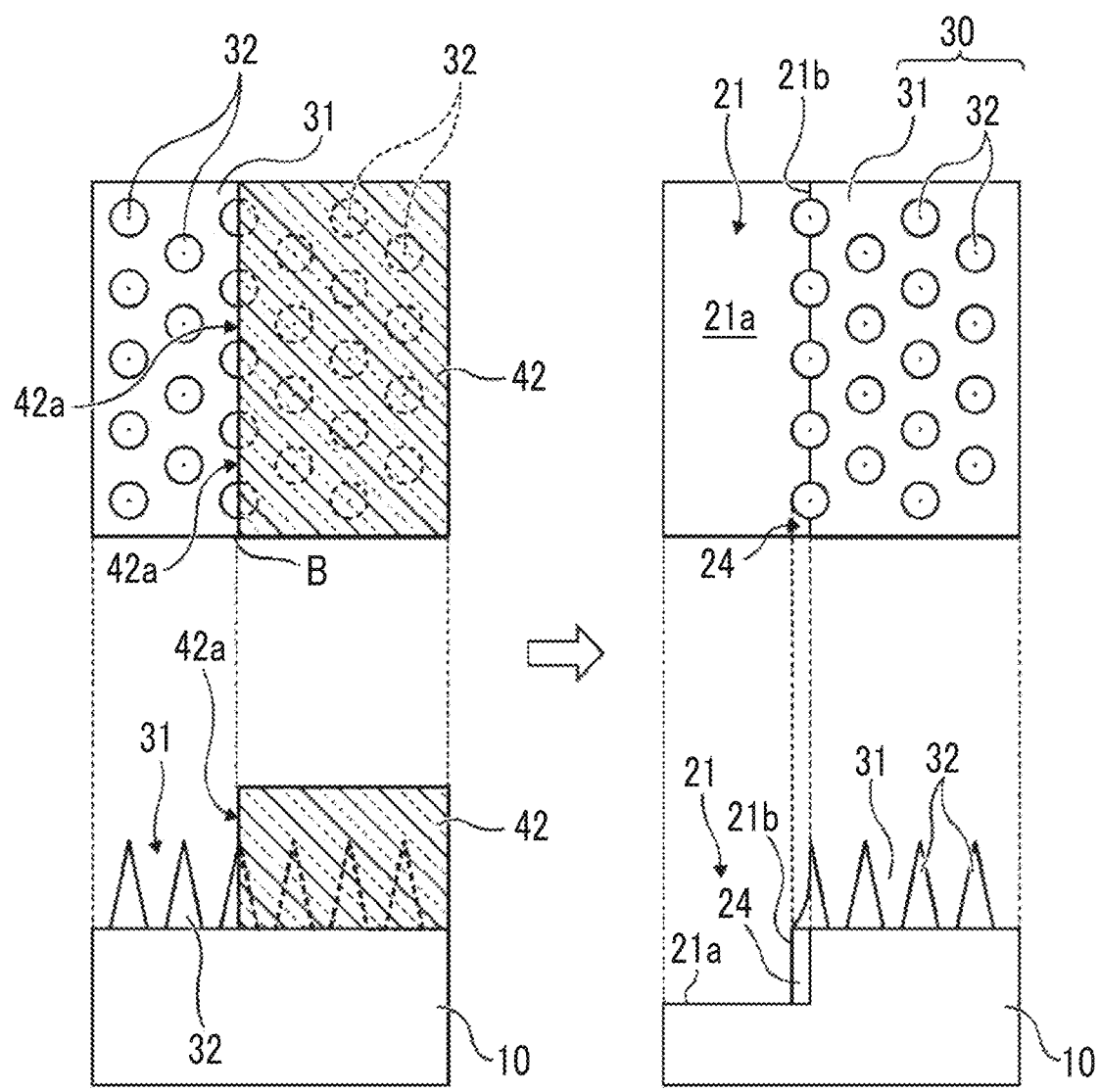
FIG. 9 is a diagram for explaining an etching step.

The reason why the streaky grooves 24 as shown in FIG. 7 are formed is, roughly speaking, the interaction between the plurality of projected portions 32 of the fine recessed and projected structure 30 and the mask 42. The principle of forming the streaky grooves 24 as shown in FIG. 7 will be described with reference to FIGS. 8 and 9. In FIGS. 8 and 9, the left drawing shows a state in which the mask 42 is formed on the fine recessed and projected structure 30 on the surface of the substrate before the dry etching step, and the right drawing shows a state in which the mask is removed after the dry etching step. In each drawing, the upper drawing is a plan view of the structure viewed from an upper side of the projected portions 32, and the lower drawing is a side view.

First, in the example of FIG. 8, in a case where the mask 42 is formed on the substrate 10, all the plurality of projected portions 32 of the fine recessed and projected structure 30 are not covered by the mask 42 in the vicinity of the boundary B corresponding to the inner wall surface 42a of an opening part of the mask 42. That is, in the left drawing of FIG. 8, the inner wall surface 42a of the opening part of the mask 42 is formed so as to bypass the skirt part of the projected portion 32 formed in a substantially conical shape.

As shown in the upper part of the left drawing of FIG. 8, a part of the inner wall surface 42a of the mask 42 that bypasses the projected portions 32 is recessed toward the inside of the mask 42 rather than the part between the adjacent projected portions 32. In a case where etching is performed to form the recessed portion 21 in this state, the part of the projected portions 32 in which the mask 42 is not provided is etched in the depth direction by etching in the vicinity of the boundary B. On the other hand, the part protected by the mask 42 is not etched. Therefore, in the vicinity of the boundary B, the part corresponding to the plurality of projected portions 32 is etched in the depth direction, and the streaky grooves 24, each of which has a width substantially corresponding to the width of the projected portion 32 and extend along the depth direction, are formed on the inner wall surface 21b of the recessed portion 21. As described above, in the example of FIG. 8, the inner wall surface 42a of the mask 42 is formed so as to bypass the plurality of projected portions 32. Therefore, the grooves 24 are formed on the inner wall surface 21b of the recessed portion 21 due to a difference in erosion rate between a part which is covered by the mask 42 and a part which is present in the projected portions 32 not covered by the mask 42.

In the example of FIG. 9, in a case where the mask 42 is formed on the substrate 10, a half of the plurality of projected portions 32 of the fine recessed and projected structure 30 is covered by the mask 42 in the vicinity of the boundary B corresponding to the inner wall surface 42a of an opening part of the mask 42. That is, as shown at the boundary B in the left drawing of FIG. 9, the inner wall surface 42a of the opening part of the mask 42 is formed linearly in a plan view. In such a case, a part of the conical projected portions 32, in the present example, a half of the projected portions 32 is covered with the mask 42. On the other hand, the remaining portion of the projected portions 32 is an exposed part that is not covered by the mask 42. In a case where etching is performed to form the recessed portion 21 in this state, the part corresponding to the exposed portion of the projected portions 32 not covered by the mask 42 in the vicinity of the boundary B is first eroded from the projected portions 32. After the projected portion 32 has been eroded, depth-directional erosion that contributes to the formation of the recessed portion 21 is initiated. On the other hand, in the part where the projected portions 32 are not provided, the depth-directional erosion that contributes to the formation of the recessed portion 21 is initiated immediately after the initiation of etching. As described above, in the vicinity of the boundary B, the part where the projected portions 32 are not provided is eroded faster by etching as compared with the part where the projected portions 32 are provided. Therefore, the part having a high erosion rate is streaky grooves 24 having a width substantially corresponding to the distance between the projected portions 32 on the inner wall surface 21b of the recessed portion 21 and extending along the depth direction. As described above, in the example of FIG. 9, in the vicinity of the boundary B corresponding to the inner wall surface 42a of the mask 42, the grooves 24 are formed in the inner wall surface 21b of the recessed portion 21 due to the difference in erosion rate between the part with the projected portions 32 and the part without the projected portions 32.

As shown above, the reason why the streaky grooves 24 as shown in FIG. 7 are formed on the inner wall surface 21b of the recessed portion 21 is the interaction between the plurality of projected portions 32 of the fine recessed and projected structure 30 and the mask 42.

It is considered that the boundary B corresponding to the inner wall surface 42a of the actual mask 42 is in a mixed state including a state in which the mask 42 is not formed on the projected portions 32 of the fine recessed and projected structure 30 as shown in FIG. 8 and a state in which a part of the projected portions 32 is covered by the mask 42 as shown in FIG. 9. In both the example of FIG. 8 and the example of FIG. 9, the plurality of streaky grooves 24 along the depth direction are formed on the inner wall surface 21b of the recessed portion 21 due to the interaction between the plurality of projected portions 32 of the fine recessed and projected structure 30 and the mask 42. Therefore, in the present manufacturing step, the width of the streaky groove 24 formed on the inner wall surface 21b and the distance for forming the grooves 24 change in accordance with the width of the projected portions 32 of the fine recessed and projected structure 30 and the distance between the projected portions 32, as described above.

In addition, etching by a so-called Bosch process, in which etching gas and etching protective gas are alternately used, which is a general method of forming recessed portions each having a high aspect ratio, may be performed. According to the Bosch process, the recessed portions each having a high aspect ratio can be efficiently formed. In a case where the recessed portions are etched using the Bosch process, it has been known that a structure called Scallops, in which streaky grooves extending in a direction intersecting with the depth direction substantially perpendicularly repeat in the depth direction, is formed on the inner wall surface of the recessed portions.

Figure 10:
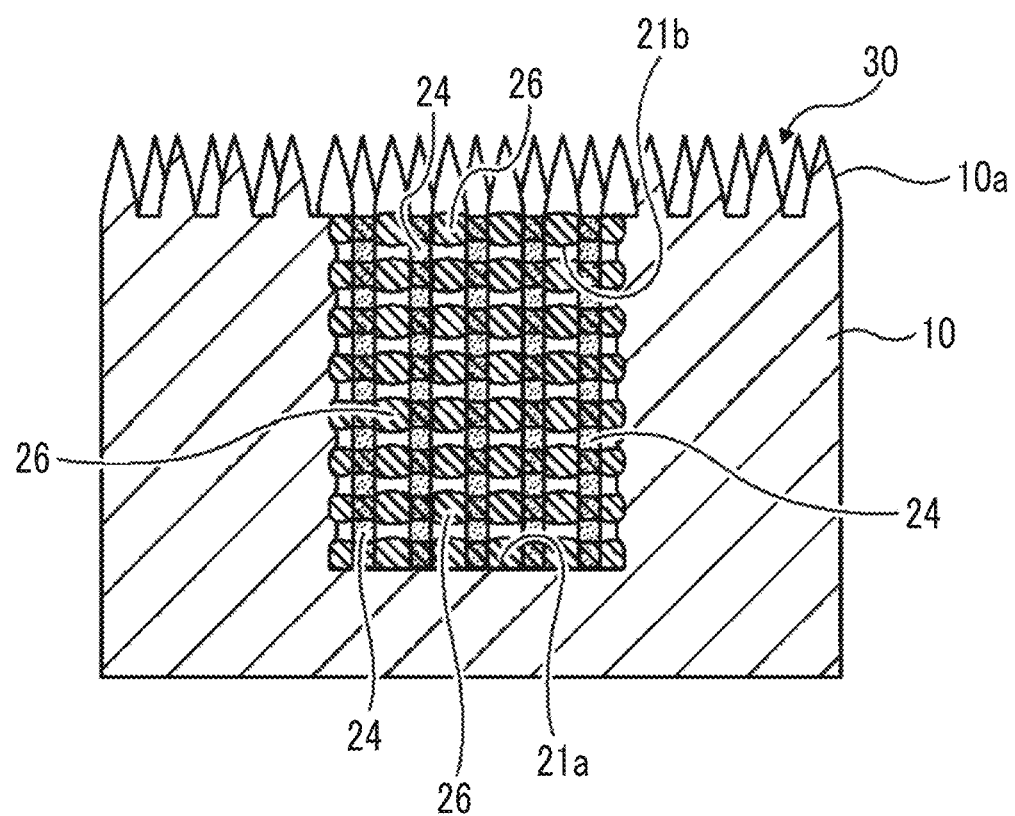
FIG. 10 is a diagram showing an inner wall surface of a recessed portion.

By using the Bosch process, in addition to the streaky grooves 24 in the depth direction shown in FIG. 7 (hereinafter referred to as first grooves 24), the streaky grooves 26 (hereinafter referred to as second grooves 26) intersecting with the depth direction substantially perpendicularly can be formed. That is, as shown in FIG. 10, grid-like recesses and projections, in which the first grooves 24 indicated by gray hatching and the streaky second grooves 26 indicated by right-down diagonal line hatching are combined, are formed on the inner wall surface 21b of the recessed portion 21. In such a case, in FIG. 10, in a part where the gray hatching and the right-down diagonal line hatching overlap, the first grooves 24 and the second grooves 26 overlap, a part having deeper grooves obtained by adding the depths of the respective grooves are formed, and recesses and projections having complicated shapes are formed.

<Mask Removal Step>

The mask removal preferably includes a dry etching step or a cleaning step using sulfuric acid hydrogen peroxide which is a mixture of sulfuric acid $H_2SO_4$ and hydrogen peroxide $H_2O_2$, for example, SH-303 manufactured by Kanto Chemical Co., Ltd.

The dry etching step of removing the mask is, for example, a step of switching to an etching gas having a high etching property for the mask and performing etching after the above-mentioned dry etching step of forming the recessed portion. The mask removal using the dry etching can be switched from the step of etching the substrate to the step of removing the mask only by switching the gas, and the work efficiency is excellent.

Further, by using the cleaning step using sulfuric acid hydrogen peroxide, the mask 42 remaining after the dry etching step of forming the recessed portion can be efficiently removed with high cleaning power.

<Step of Providing Substrate with Fine Recessed and Projected Structure>

In the above manufacturing method, as a step of providing a substrate having a fine recessed and projected structure 30, a fine recessed and projected structure formation step of forming the fine recessed and projected structure 30 on a surface of a workpiece substrate 9 having a flat surface may be included. For example, the fine recessed and projected structure formation step includes a step of forming a thin film including aluminum on the surface of the workpiece substrate, a step of changing the thin film including aluminum into a fine recessed and projected layer including alumina hydrate by hot water treatment, a step of etching the surface of the workpiece substrate from the fine recessed and projected layer side, and a step of removing the fine recessed and projected layer. The procedure of the present example will be described below with reference to FIG. 11.

As shown in ST12 of FIG. 11, first, a thin film 50 including aluminum (hereinafter referred to as an Al-containing thin film 50) is formed on the surface of the workpiece substrate 9.

The Al-containing thin film 50 is, for example, a thin film made of any one of aluminum, aluminum oxide, aluminum nitride, or an aluminum alloy, but may be made of a material changed into a fine recessed and projected layer including an alumina hydrate such as boehmite by hot water treatment in a subsequent step. The "aluminum alloy" includes at least one element such as silicon (Si), iron (Fe), copper (Cu), manganese (Mn), magnesium (Mg), zinc (Zn), chromium (Cr), titanium (Ti), and nickel (Ni), and means a compound or a solid solution including aluminum as a main component. From the viewpoint of forming the recessed and projected structure, it is preferable that the Al-containing thin film 50 has an aluminum component ratio of 80 mol % or more with respect to all metal elements.

The thickness of the Al-containing thin film 50 may be set in accordance with the desired thickness of the fine recessed and projected layer obtained in the subsequent step. For example, the thickness of the Al-containing thin film 50 is in a range of 0.5 to 60 nm, preferably in a range of 2 to 40 nm, and particularly preferably in a range of 5 to 20 nm.

The method of forming the Al-containing thin film 50 is not particularly limited. For example, general film formation methods such as a resistance heating vapor deposition method, an electron beam vapor deposition method, and a sputtering method can be used. Further, as a method of forming the Al-containing thin film 50 in the recessed portion 21, an electrodeposition bath may be used.

Figure 11:
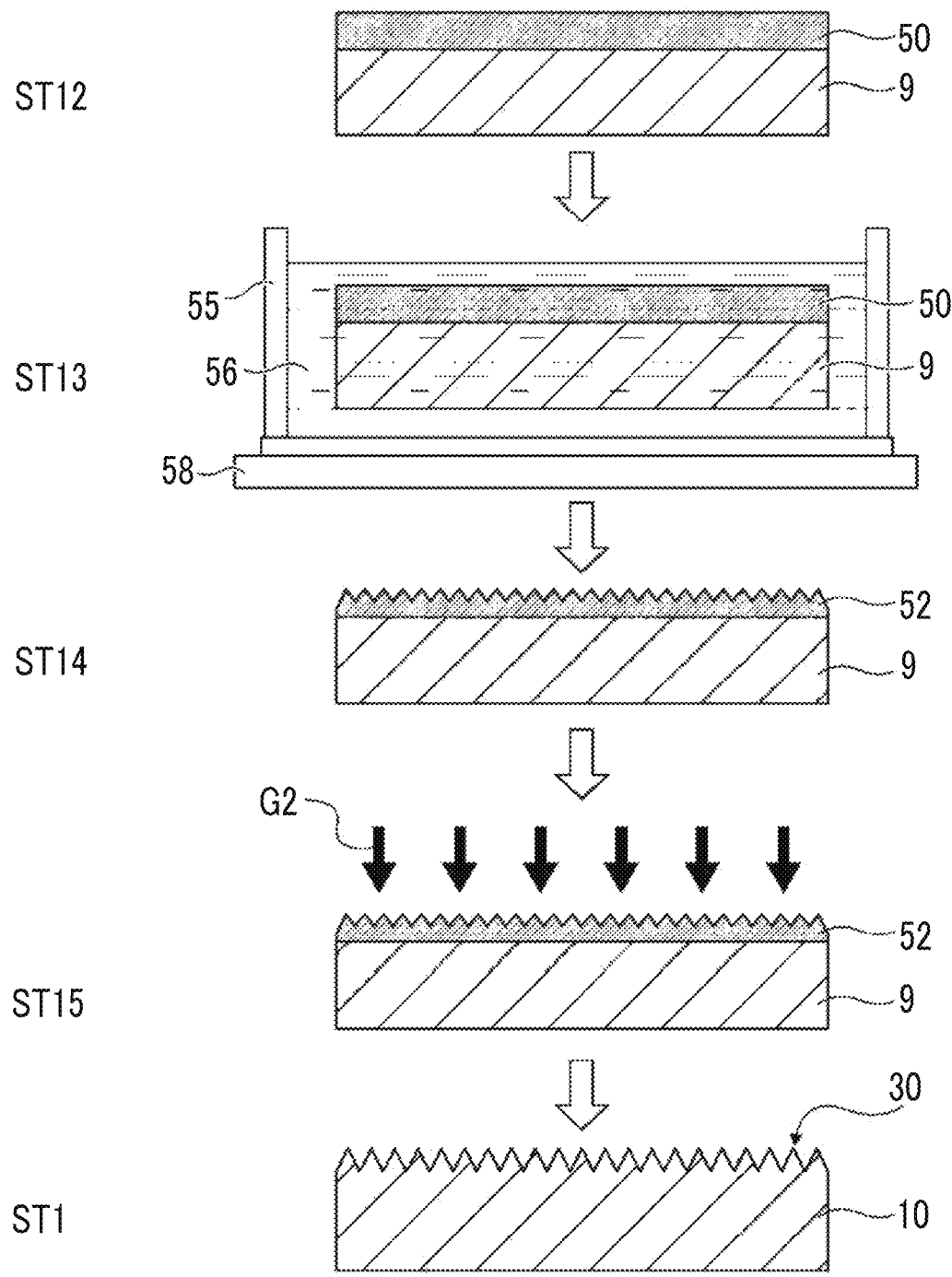
FIG. 11 is a diagram showing a step of manufacturing a substrate having a fine recessed and projected structure.

Next, as shown in ST13 of FIG. 11, in the hot water treatment step, the Al-containing thin film 50 is subjected to hot water treatment. For example, as shown in ST13 of FIG. 11, the entire workpiece substrate 9 on which the Al-containing thin film 50 is formed is immersed in hot water by heating the pure water 56 in the container 55 using the hot plate 58. By hot water treatment, as shown in ST14 of FIG. 11, the Al-containing thin film 50 can be changed into a fine recessed and projected layer 52 including an alumina hydrate. The fine recessed and projected layer 52 has a plurality of projected portions and a plurality of recessed portions formed in an irregular shape and arrangement. The size of the projected portions of the recessed and projected structure layer and the average distance between the projected portions (that is, the average period of the recesses and projections) can be controlled by the material of the Al-containing thin film 50, the formation thickness, and the hot water treatment conditions. However, the average period thereof is approximately 1 μm or less.

The "hot water treatment" in the hot water treatment step means a treatment in which hot water acts on a thin film that contains aluminum. Examples of the hot water treatment include a method of immersing the laminate in which the thin film 50 including aluminum is formed in water at room temperature and then boiling the water, a method of immersing the laminate in hot water maintained at a high temperature, or a method of exposing the laminate to high temperature steam. As described above, in the present embodiment, the pure water 56 in the container 55 is heated by using the hot plate 58 to make hot water, and the substrate 10 is immersed in the hot water. The time for immersing in hot water and the temperature of hot water are appropriately set in accordance with the desired recessed and projected structure. The time as a standard is 1 minute or more, particularly 3 minutes or more, and suitably 15 minutes or less. The temperature of the hot water is preferably 60° C. or higher, and particularly preferably higher than 90° C. The higher the temperature, the shorter the treatment time tends to be. For example, in a case where a thin film including aluminum having a thickness of 10 nm is boiled in hot water at 100° C. for 3 minutes, it is possible to obtain a recessed and projected structure in which the projected portions are randomly disposed at distances between the projected portions in a range of 50 to 300 nm and heights of the projected portions in a range of 50 to 100 nm.

Further, as shown in ST15 of FIG. 11, etching using the etching gas G2 from the fine recessed and projected layer 52 side to the surface 10a of the workpiece substrate 9 on which the fine recessed and projected layer 52 including alumina hydrate is formed is performed. Thereby, the fine recessed and projected structure 30 can be formed on the surface 10a of the substrate 10 as shown in ST1. In a case where etching is performed from the surface of the fine recessed and projected layer 52, the recessed and projected shape of the surface of the fine recessed and projected layer 52 gradually recedes due to dissolution erosion due to etching, and dissolution erosion acts such that the recesses and projections of the fine recessed and projected layer 52 are reflected on the surface 10a of the substrate 10. Thereby, the fine recessed and projected structure 30, in which the form of the fine recessed and projected layer 52 is reflected on the substrate surface 10a, is formed. It should be noted that the meaning that the recessed and projected shape of the fine recessed and projected layer 52 is "reflected" means a state in which projected portions or recessed portions are provided at positions one-to-one corresponding to the projected portions or recessed portions of the recessed and projected shape, that is, a state in which there is some similarity to the undulations regardless of the position accuracy of transfer.

In the etching step, it is preferable to use, for example, reactive ion etching, reactive ion beam etching, or the like. It is preferable to perform etching under the condition that the etching rate of the substrate 10 is higher than the etching rate of the fine recessed and projected layer 52. Examples of the etching gas G2 having a high efficiency of etching for the substrate 10 include a fluorine-based gas or a chlorine-based gas similar to the etching gas G1.

Figure 12:
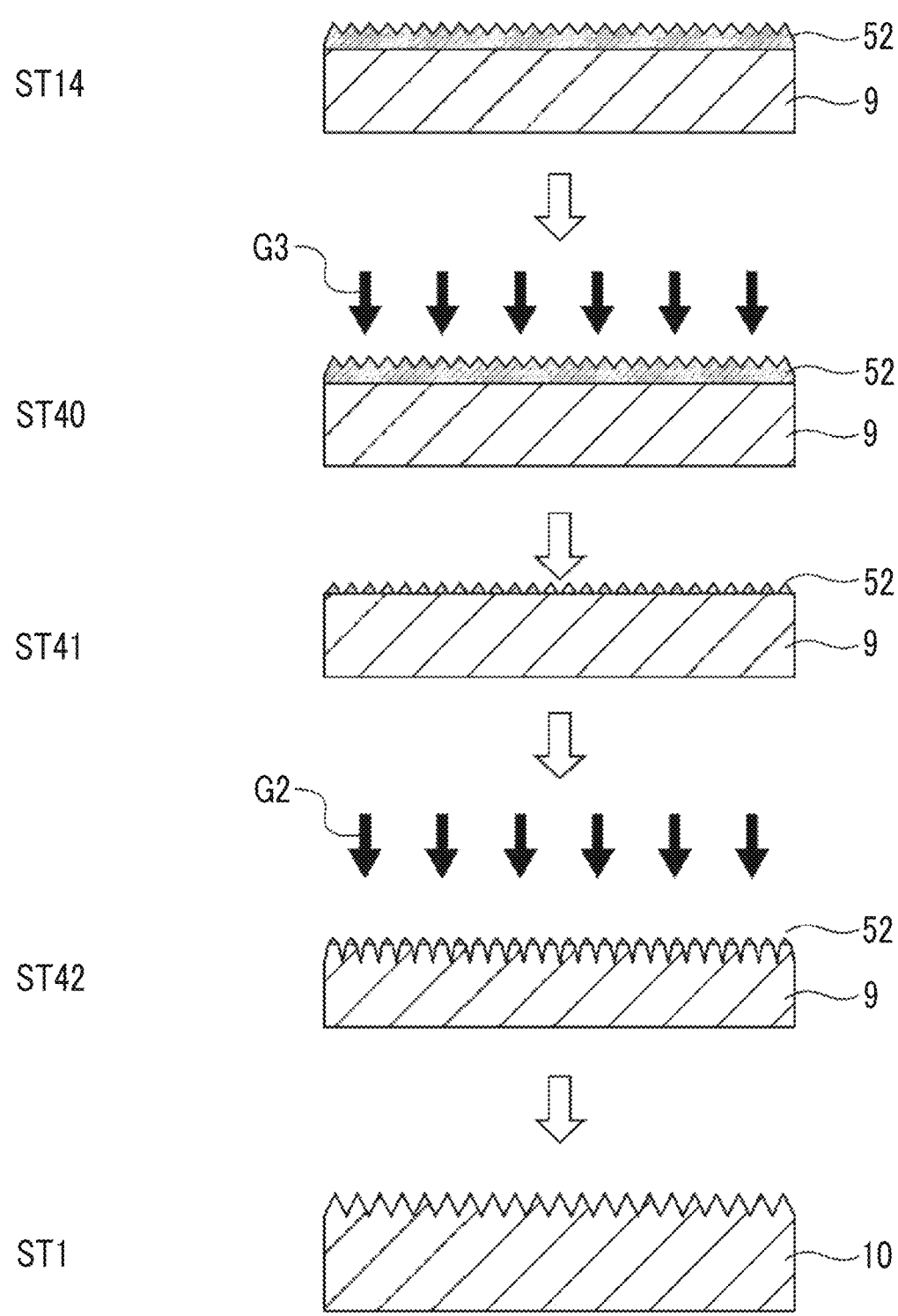
FIG. 12 is a diagram showing a step of breakthrough treatment for a fine recessed and projected layer including alumina hydrate.

Before the etching step of the substrate surface 10a, it is preferable to perform the breakthrough treatment of etching the fine recessed and projected layer 52 until at least a part of the surface of the workpiece substrate 9 is exposed. Specifically, as shown in FIG. 12, after the fine recessed and projected layer 52 is formed (ST14), the fine recessed and projected layer 52 is etched (ST40). In at least a part of the recessed portion of the fine recessed and projected layer 52, the bottom surface 21a of the recessed portion 21 is exposed (ST41). In this breakthrough treatment, in order to efficiently etch the fine recessed and projected layer 52, an etching gas G3 having a high efficiency of etching for alumina hydrate is used. As the etching gas G3, for example, a gas including argon (Ar) and trifluoromethane ($CHF_3$) is used. Thereafter, in order to form the fine recessed and projected structure 30 on the surface of the workpiece substrate 9, as shown in ST42 of FIG. 12, the surface of the workpiece substrate 9 is etched using the etching gas G2 from the fine recessed and projected layer 52 side. Thereby, the substrate 10 having the fine recessed and projected structure 30 on the surface 10a is obtained (ST1). By performing the breakthrough treatment, the time required for the etching step of the workpiece substrate can be significantly shortened. Therefore, the manufacturing efficiency of the entire manufacturing step can be improved.

The mask removal step preferably includes a cleaning step using sulfuric acid hydrogen peroxide. By using sulfuric acid hydrogen peroxide, the fine recessed and projected layer 52 remaining after the etching step can be efficiently removed.

The method of manufacturing a substrate having a fine recessed and projected structure on the surface thereof is not limited to the above. The substrate having the fine recessed and projected structure on the surface may be produced by irregularly attaching fine particles such as Cr to the flat plate-shaped workpiece substrate and etching the substrate surface using the particles as a mask. Further, a resin layer is formed on the surface of the workpiece substrate, and the recessed and projected pattern of the mold having the recessed and projected pattern is pressed against the resin layer to transfer the recessed and projected pattern to the resin layer, thereby forming a mask by the resin layer on the surface of the substrate. By etching the surface of the workpiece substrate using this resin layer as a mask, the substrate having the fine recessed and projected structure on the surface may be produced. However, as described above, according to the method of forming the fine recessed and projected structure including alumina hydrate, irregular fine recesses and projections of 1 μm or less can be easily produced. Therefore, a substrate having a fine recessed and projected structure can be efficiently produced.

In the structure 1 shown in FIG. 1, the recessed portion 21 is a bottomed recessed portion, but the recessed portion in the structure of the present disclosure may be a through-hole. That is, in the manufacturing method of the present disclosure, in the dry etching step of forming the recessed portion, etching may be performed until the recessed portion penetrates. A structure having a plurality of through-holes in the substrate and having the fine recessed and projected structure on the surface of the substrate can be used, for example, as an optical member that emits incident light as parallel light. In a case where the structure is used as such an optical member, it is possible to prevent the reflection of light incident on a part other than the through-holes by the antireflection function due to the fine recessed and projected structure of the surface. In addition, the inner wall surface of the through-holes is provided with streaky grooves along the depth direction, streaky grooves along the direction intersecting the depth direction, or grid-like grooves in which the streaky grooves along the depth direction and the streaky grooves along the direction intersecting the depth direction are combined. Thereby, it is possible to suppress the reflection of the oblique light component, which is incident on the inner wall surface, in the light incident on the through-holes, by the inner wall surface. As a result, it is possible to improve the accuracy of collimation of light.

Further, the structure having the through-holes can be used as a biochip for combining a test substance with a trapping substance and detecting biochemical reactions by fixing the trapping substance in the through-holes and circulating the sample liquid including the test substance from one opening to the other opening. By fixing different trapping substances in each of the plurality of through-holes, the structure can be used as a biochip for simultaneous detection of multiple items. In such a case, as shown in FIG. 7 or 10, in a case where the inner wall surface of the recessed portions is provided with the plurality of grooves, the adhesiveness of the trapping substance is improved. As a result, it is possible to obtain an effect of improving the detection sensitivity.

EXAMPLES

A structural member was produced in accordance with an example of the structure manufacturing method described above. The specific manufacturing method is as follows.

A silicon wafer was used as the workpiece substrate, and a substrate having a fine recessed and projected structure on the surface was first produced. Specifically, first, a thin aluminum film was formed on the surface of the workpiece substrate by the sputtering method. The thickness of the thin aluminum film was 10 nm. Then, as the hot water treatment, the substrate was immersed in boiling pure water for 3 minutes to change the thin aluminum film into a fine recessed and projected layer including alumina hydrate. Thereafter, the breakthrough treatment is performed from the surface of the fine recessed and projected layer using a mixed gas of Ar gas and $CHF_3$ gas, and reactive ion etching is performed using a mixed gas of $SF_6$ gas and $CHF_3$ gas. Thereby, the fine recessed and projected structure was formed on the surface of the workpiece substrate. In such a manner, the substrate having the fine recessed and projected structure on the surface was obtained.

Then, the photoresist was applied on the fine recessed and projected structure of the substrate having the fine recessed and projected structure on the surface, and an exposure mask having a predetermined opening was placed on the photoresist to perform laser exposure of the photoresist. Further, by performing the development treatment, a mask that has an opening pattern was formed. Then, using this mask, reactive ion etching was performed using a mixed gas of $SF_6$ gas and $CHF_3$ gas as the etching gas to form the recessed portions on the surface of the substrate.

Finally, sulfuric acid hydrogen peroxide cleaning was performed to remove the mask.

FIG. 12 is a SEM image showing a part of the structure produced as described above. As shown in FIG. 12, the structure has a plurality of recessed portions on the surface of the substrate. The opening of the recessed portion had a square shape with a side of 20 μm, and the depth of the recessed portion was 10 μm.

Figure 13:
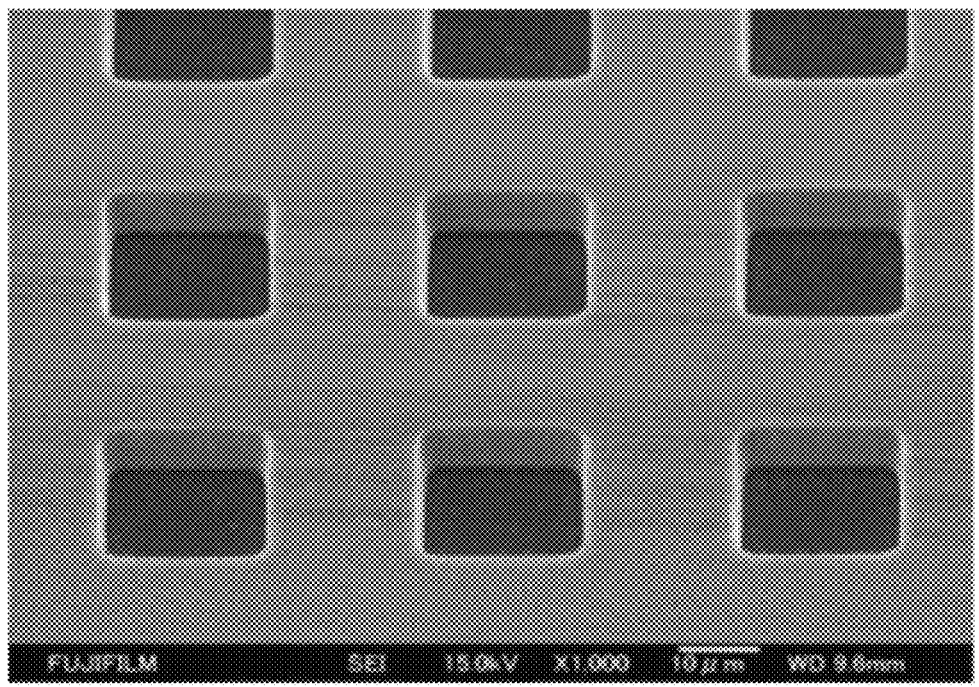
FIG. 13 is a scanning micrograph showing a part of the structure of the example.
Figure 14:
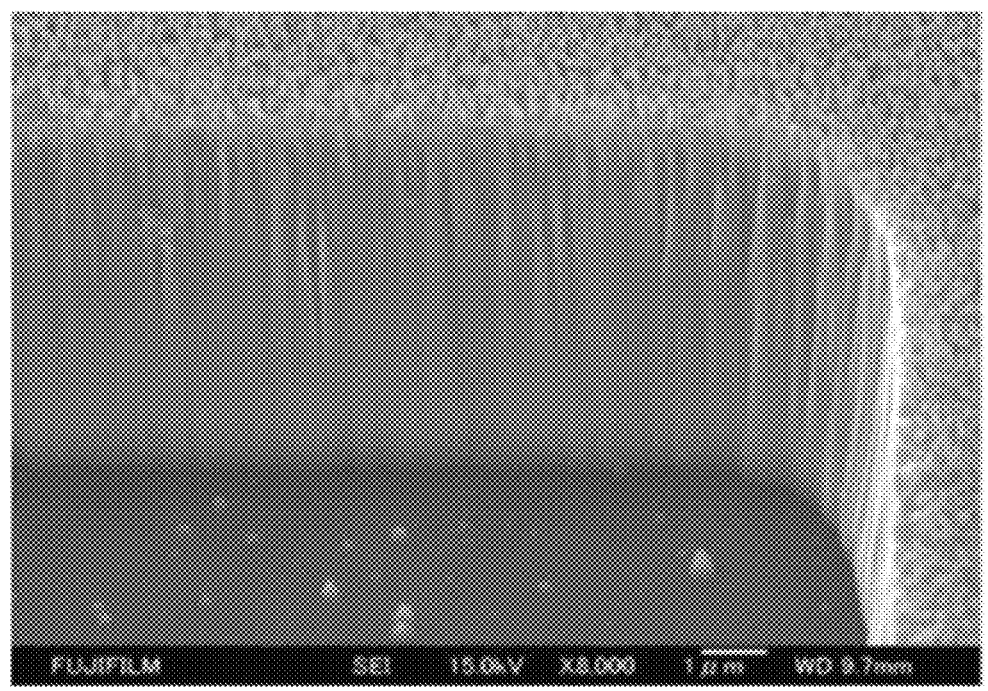
FIG. 14 is an enlarged scanning micrograph of the part of the structure shown in FIG. 13.
Figure 15:
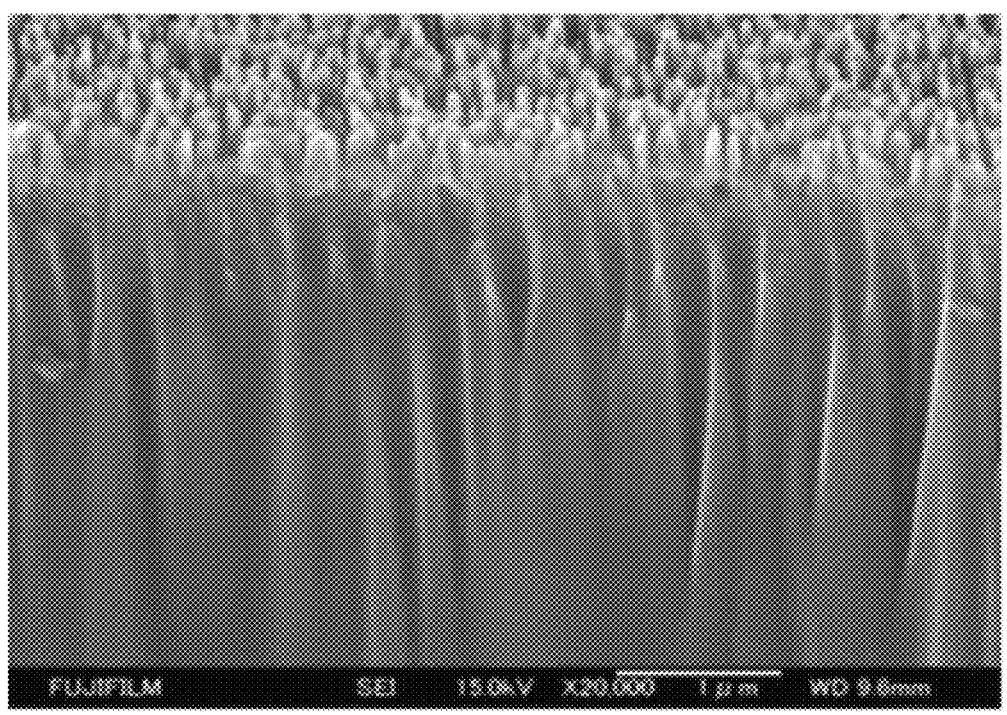
FIG. 15 is a further enlarged scanning micrograph of the part of the structure shown in FIG. 14.

FIG. 13 is an enlarged SEM image of the inner wall surface part of one of the recessed portions in FIG. 12, and FIG. 14 is a further enlarged SEM image of the upper portion of the inner wall surface of FIG. 13. From FIGS. 13 and 14, it can be seen that the fine recessed and projected structure is formed on the surface of the substrate. Further, the part observed in dark color in FIG. 13 is the bottom surface of the recessed portion, and the fine recessed and projected structure as formed on the surface of the substrate is not formed on the bottom surface. Further, it can be seen that the streaky grooves formed in accordance with the surface fine recessed and projected structure is formed on the wall surface of the recessed portion.

As described above, according to an example of the structure manufacturing method, by providing the fine recessed and projected structure which has an average period of 1 μm or less and is formed only on the surface of the substrate having a relatively large recessed portion and at least on the periphery of the recessed portion on the surface, it was possible to produce the structure not having the fine recessed and projected structure on the bottom surface of the recessed portion.

The present disclosure of JP2020-055019A filed on Mar. 25, 2020 is incorporated herein by reference in its entirety.

All documents, patent applications, and technical standards described in the present specification are incorporated into the present specification by reference to the same extent as in a case where the individual documents, patent applications, and technical standards were specifically and individually stated to be incorporated by reference.

What is claimed is:

1. A method of manufacturing a mold including a recessed portion and a recessed and projected structure formed on the periphery of the recessed portion, the method comprising:
    a mask formation step of forming a mask that has an opening pattern on substrate having the recessed and projected structure with an average period of 1 µm or less on a surface thereof;
    a dry etching step of etching the surface of the substrate from a side of the mask to form the recessed portion which has an opening greater than the average period of the recessed and projected structure according to the opening pattern of the mask, the recessed portion having a depth equal to or greater than double a difference in height between recesses and projections of the recessed and projected structure;
    a mask removal step of removing the mask after the dry etching step, thereby producing the mold; and
    a recessed and projected structure formation step of forming the recessed and projected structure on the surface of the substrate,
    wherein the recessed and projected structure formation step includes a step of forming a thin film including aluminum on the surface of the substrate, a step of changing the thin film including aluminum into a recessed and projected layer including alumina hydrate through hot water treatment using water having a temperature of 60° C. or higher, a step of etching the surface of the substrate from a side of the recessed and projected layer, and a step of removing the recessed and projected layer.

2. The method of manufacturing a mold according to claim 1, wherein the recessed and projected structure is an irregular structure.

3. The method of manufacturing a mold according to claim 1, wherein the recessed portion formed in the dry etching step is a through-hole penetrating the substrate.

4. The method of manufacturing a mold according to claim 1, wherein in the dry etching step, streaky grooves along a depth direction of the recessed portion are formed in at least a part of an inner wall surface of the recessed portion.

5. The method of manufacturing a mold according to claim 1, wherein an etching gas used in the dry etching step includes a fluorine-based gas or a chlorine-based gas.

6. The method of manufacturing a mold according to claim 1, wherein an etching gas and an etching protective gas are alternately used in the dry etching step.

7. The method of manufacturing a mold according to claim 1, wherein the mask formation step includes a step of applying a photoresist, a step of exposing the photoresist, and a step of developing the photoresist.

8. The method of manufacturing a mold according to claim 1, wherein the mask formation step includes a resin layer coating step and a pattern transfer step to the resin layer.

9. The method of manufacturing a mold according to claim 1, wherein the mask removal step includes a dry etching step or a cleaning step using sulfuric acid hydrogen peroxide.

10. The method of manufacturing a mold according to claim 1, wherein the substrate is a silicon substrate or a silicon compound substrate.

* * * * *